(12) United States Patent
Kim et al.

(10) Patent No.: US 11,386,254 B2
(45) Date of Patent: Jul. 12, 2022

(54) SEMICONDUCTOR CIRCUIT AND SEMICONDUCTOR CIRCUIT LAYOUT SYSTEM

(71) Applicant: SAMSUNG ELECTRONICS CO., LTD., Suwon-si (KR)

(72) Inventors: Ah Reum Kim, Daegu (KR); Min Su Kim, Hwaseong-si (KR); Young O Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 348 days.

(21) Appl. No.: 16/549,989

(22) Filed: Aug. 23, 2019

(65) Prior Publication Data

US 2020/0192997 A1 Jun. 18, 2020

(30) Foreign Application Priority Data

Dec. 13, 2018 (KR) .......... 10-2018-0161145
Feb. 28, 2019 (KR) .......... 10-2019-0024040

(51) Int. Cl.
*G06F 30/398* (2020.01)
*H01L 27/092* (2006.01)
*H01L 27/02* (2006.01)
*G06F 30/392* (2020.01)

(52) U.S. Cl.
CPC .......... *G06F 30/398* (2020.01); *G06F 30/392* (2020.01); *H01L 27/0207* (2013.01); *H01L 27/092* (2013.01)

(58) Field of Classification Search
CPC .............. G06F 30/398; H01L 27/0207
USPC .............................................. 716/112
See application file for complete search history.

(56) References Cited

U.S. PATENT DOCUMENTS

| | | |
|---|---|---|
| 5,227,674 A * | 7/1993 | Takahashi ............ G11C 7/1087 327/208 |
| 6,333,656 B1 | 12/2001 | Schober |
| 8,274,319 B2 | 9/2012 | Maeno |
| 9,123,565 B2 | 9/2015 | Lu et al. |
| 9,317,646 B2 | 4/2016 | Lu et al. |
| 9,397,101 B2 | 7/2016 | Chintarlapalli et al. |
| 9,514,260 B2 | 12/2016 | Kim |
| 9,514,264 B1 | 12/2016 | Nebesnyi |
| 9,893,063 B2 | 2/2018 | Jain et al. |
| 10,573,398 B1* | 2/2020 | Chun .................... G11C 17/18 |
| 2002/0030513 A1* | 3/2002 | Toyoshima ........ H03K 19/0027 326/112 |
| 2011/0095799 A1* | 4/2011 | Ramaraju ........ H03K 3/356156 327/208 |
| 2012/0032264 A1* | 2/2012 | Marino .................. H01L 27/11 257/350 |

(Continued)

*Primary Examiner* — Suchin Parihar
(74) *Attorney, Agent, or Firm* — Volentine, Whitt & Francos, PLLC

(57) ABSTRACT

A semiconductor circuit and a layout system of the semiconductor circuit, the semiconductor circuit including a latch; a feedback inverter that receives an output signal of the latch via a first node and provides a feedback signal to the latch responsive to the output signal of the latch; and an output driver which receives the output signal of the latch via the first node and provides an output signal externally of the semiconductor circuit. The output driver includes an even number of inverters, and the latch, the feedback inverter, and the output driver share a single active region formed without isolation.

20 Claims, 17 Drawing Sheets

(56) References Cited

U.S. PATENT DOCUMENTS

2016/0301397 A1* 10/2016 Nakanishi .............. H03K 3/037
2017/0317666 A1    11/2017 Liu et al.
2021/0119616 A1*  4/2021 Hsu ................ G01R 31/318541

* cited by examiner

L08

SEMICONDUCTOR CIRCUIT AND SEMICONDUCTOR CIRCUIT LAYOUT SYSTEM

CROSS-REFERENCE TO RELATED APPLICATION

A claim of priority under 35 U.S.C. § 119 is made to Korean Patent Application No. 10-2018-0161145 filed on Dec. 13, 2018 and Korean Patent Application No. 10-2019-0024040 filed on Feb. 28, 2019, both filed in the Korean Intellectual Property Office, the entire contents of which are hereby incorporated by reference.

BACKGROUND

The present inventive concepts relate to semiconductor circuits, and a layout system of semiconductor circuits.

The reduction of the area of integrated circuits (ICs) such as system-on-chip (SoC) typically used in mobile devices is important from the viewpoint of productivity of the mobile devices. On the other hand, with the increased demand for electronic devices such as mobile devices having advanced features, improvement in the performance of ICs is needed.

In order to minimize area while achieving improvement of cell performance of ICs, effort has focused on the design layout of semiconductor circuits (e.g., standard cells) having small area that implement and incorporate all semiconductor elements required for improving performance.

SUMMARY

Embodiments of the inventive concepts provide a semiconductor circuit and a layout system of the semiconductor circuit capable of preventing or minimizing increase of a layout area of a latch or a flip-flop, while improving the performance of the output driver of the latch or the flip-flop.

Embodiments of the inventive concepts provide a semiconductor circuit including a latch; a feedback inverter which receives an output signal of the latch via a first node and provides a feedback signal to the latch responsive to the output signal of the latch; and an output driver which receives the output signal of the latch via the first node and provides the output signal externally of the semiconductor circuit responsive to the output signal of the latch. The output driver includes an even number of inverters, and the latch, the feedback inverter, and the output driver share a single active region formed without isolation.

Embodiments of the inventive concepts further provide a semiconductor circuit including a first PMOS transistor disposed on a first gate line to which a signal of a first node is applied and that provides a power supply voltage to a second node responsive to the signal at the first node; a first NMOS transistor disposed on the first gate line and that provides a ground voltage to the second node responsive to the signal at the first node, the first PMOS transistor and the first NMOS transistor configured as a feedback inverter; a second PMOS transistor disposed on a second gate line to which the signal of the first node is applied and which is formed adjacent to the first gate line, and that provides the power supply voltage to a third node responsive to the signal at the first node; a second NMOS transistor disposed on the second gate line and that provides the ground voltage to the third node; a third PMOS transistor disposed on a third gate line to which the signal of the first node is applied and which is disposed adjacent to the second gate line, and that provides the power supply voltage to the third node responsive to the signal at the first node; and a third NMOS transistor disposed on the third gate line and that provides the ground voltage to the third node responsive to the signal at the first node, the second PMOS transistor, the second NMOS transistor, the third PMOS transistor and the third NMOS transistor configured as an output driver, wherein the output driver shares the power supply voltage and the ground voltage, the power supply voltage and the ground voltage are respectively applied through a first VDD power contact and a first VSS power contact disposed between the output driver and the latch that receives a signal at the second node as a feedback input, and the output driver shares the power supply voltage and the ground voltage, the power supply voltage and the ground voltage are respectively applied through a second VDD power contact and a second VSS power contact disposed between the feedback inverter and the output driver.

Embodiments of the inventive concepts still further provide a semiconductor circuit including a latch which receives a signal of a first node as a feedback signal via a second node; a first PMOS transistor disposed on a first gate line to which the signal of the first node is applied and which is disposed adjacent to one side of the latch, and that provide a power supply voltage to the second node responsive to the signal of the first node; a first NMOS transistor disposed on the first gate line and that provides a ground voltage to the second node responsive to the signal of the first node, the first PMOS transistor and the first NMOS transistor configured as a feedback inverter; a second PMOS transistor disposed on a second gate line to which the signal of the first node is applied and which is formed adjacent to another side of the latch, and that provides a power supply voltage to a third node responsive to the signal of the first node; a second NMOS transistor disposed on the second gate line and that provides the ground voltage to the third node responsive to the signal of the first node; a third PMOS transistor disposed on a third gate line to which the signal of the first node is applied and which is disposed adjacent to the second gate line, and that provides the power supply voltage to the third node responsive to the signal of the first node; and a third NMOS transistor disposed on the third gate line and that provides the ground voltage to the third node responsive to the signal of the first node, the second PMOS transistor, the second NMOS transistor, the third PMOS transistor and the third NMOS transistor configured as an output driver, wherein the feedback inverter shares the power supply voltage and the ground voltage with the latch, the power supply voltage and the ground voltage are respectively applied through a first VDD power contact and a first VSS power contact disposed between the latch and the feedback inverter, and the output driver shares the power supply voltage and the ground voltage with the latch, the power supply voltage and the ground voltage are respectively applied through a second VDD power contact and a second VSS power contact disposed between the latch and the output driver.

Embodiments of the inventive concepts also provide a layout system of a semiconductor circuit including one or more processors; a storage in which one or more standard cell designs are stored; and a layout module configured to lay out the one or more standard cell designs in accordance with defined requirements, using the one or more processors. The layout module is further configured to lay out a latch, a feedback inverter which receives an output signal of the latch via a first node and provides a feedback signal to the latch responsive to the output signal, and an output driver which receives the output signal of the latch through the first node and provides an output signal. The output driver includes an even number of inverters, and the latch, the feedback inverter and the output driver share a single active region formed without isolation.

BRIEF DESCRIPTION OF THE DRAWINGS

The above and other aspects and features of the inventive concepts will become more apparent in view of the following description of example embodiments as taken with reference to the attached drawings, in which.

DETAILED DESCRIPTION OF THE EMBODIMENTS

Hereinafter, various embodiments of the inventive concepts will be described with reference to the attached drawings.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
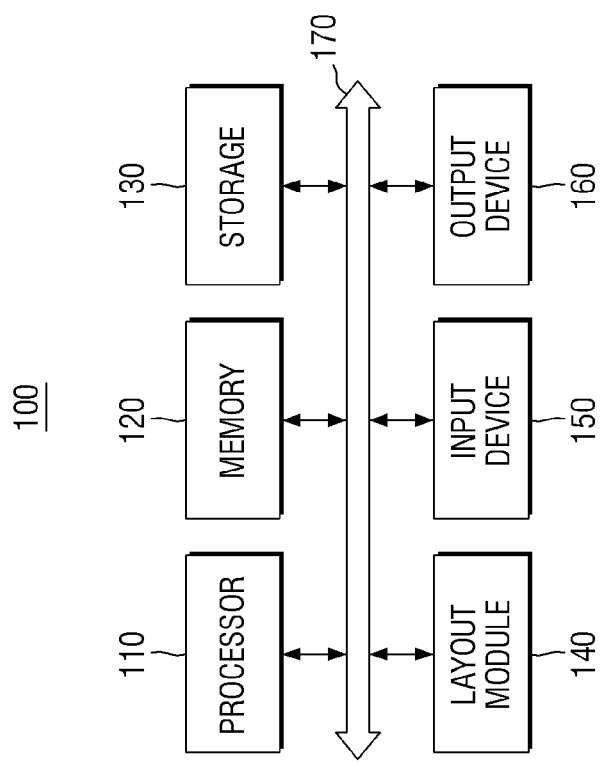
FIG. 1 is a block diagram explanatory of a layout system of a semiconductor circuit according to embodiments of the inventive concepts.

FIG. 1 illustrates a block diagram explanatory of a layout system for a semiconductor circuit according to embodiments of the inventive concepts.

Referring to FIG. 1, a layout system 100 for a semiconductor circuit according to embodiments of the inventive concepts may execute a layout of the semiconductor circuit.

The layout system 100 includes a processor 110, a memory 120, storage 130, a layout module 140, an input device 150 and an output device 160. Further, the processor 110, the memory 120, the storage 130, the layout module 140, the input device 150 and the output device 160 are electrically connected via the bus 170 and may exchange the data with each other. However, layout systems according to other embodiments of the inventive concepts are not limited to including the above described components or circuits, and the layout systems of such other embodiments may be implemented without certain of the processor 110, the memory 120, the storage 130, the layout module 140, the input device 150 and the output device 160, or may be implemented to further include additional components or circuits (e.g., a display device) not illustrated in FIG. 1, depending on the specific implementation purpose.

The layout module 140 performs the layout of a semiconductor circuit such as described hereinafter. The layout module 140 may be implemented by software, hardware or a combination of software and hardware. When implemented by software, the layout module 140 may include one or more instructions for performing the layout of a semiconductor circuit. On the other hand, when implemented by hardware, the layout module 140 may include, for example, one or more programmable electronic circuits for performing the layout of a semiconductor circuit. On the other hand, a part of the layout module 140 may be implemented by software, and another part of the layout module 140 may be implemented by hardware.

The layout module 140 may lay out one or more standard cell designs according to defined requirements (e.g., design rules) using the processor 110. The standard cell designs may be stored in the storage 130. The layout of the semiconductor circuit performed by the layout module 140 will be described hereinafter in connection with FIGS. 3 to 5 and 7 to 11.

The processor 110 controls the overall operation of the layout system 100. In particular, processor 110 may control or execute the layout module 140 to perform the layout of the semiconductor circuits described herein. In some embodiments of the inventive concepts, the processor 110 may for example be implemented by a central processing unit (CPU), a graphic processing unit (GPU) and the like, however embodiments of the inventive concepts are not limited thereto.

The memory 120 provides a space capable of storing instructions, program code, data, and the like required for the layout module 140 to perform the layout of a semiconductor circuit. In some embodiments of the inventive concepts, the memory 120 may be implemented using volatile memory such as for example dynamic random access memory (DRAM), static random access memory (SRAM), and the like, however embodiments of the inventive concepts are not limited thereto and the memory 120 may be implemented using non-volatile memory such as for example flash memory.

When all or part of the layout module 140 is implemented by software, the storage 130 may store the instructions or program code, may store the data required for the layout module 140 to execute the layout of a semiconductor circuit, or may store, for example, constraints such as design rules, data of various elements used in the layout of the semiconductor circuit, and layout related data such as standard cell data. In some embodiments of the inventive concepts, the storage 130 may be implemented using solid state drive (SSD), hard disk drive (HDD) and the like. However, embodiments of the inventive concepts are not limited thereto, and the storage 130 may be implemented by non-transitory computer readable medium.

The layout system 100 may receive layout related data from the user or other devices implemented inside/outside the layout system 100 via the input device 150, and may transmit layout related data, stored data, result data and the like to the user or other devices implemented inside/outside the layout system 100 via the output device 160.

Figure 2A:
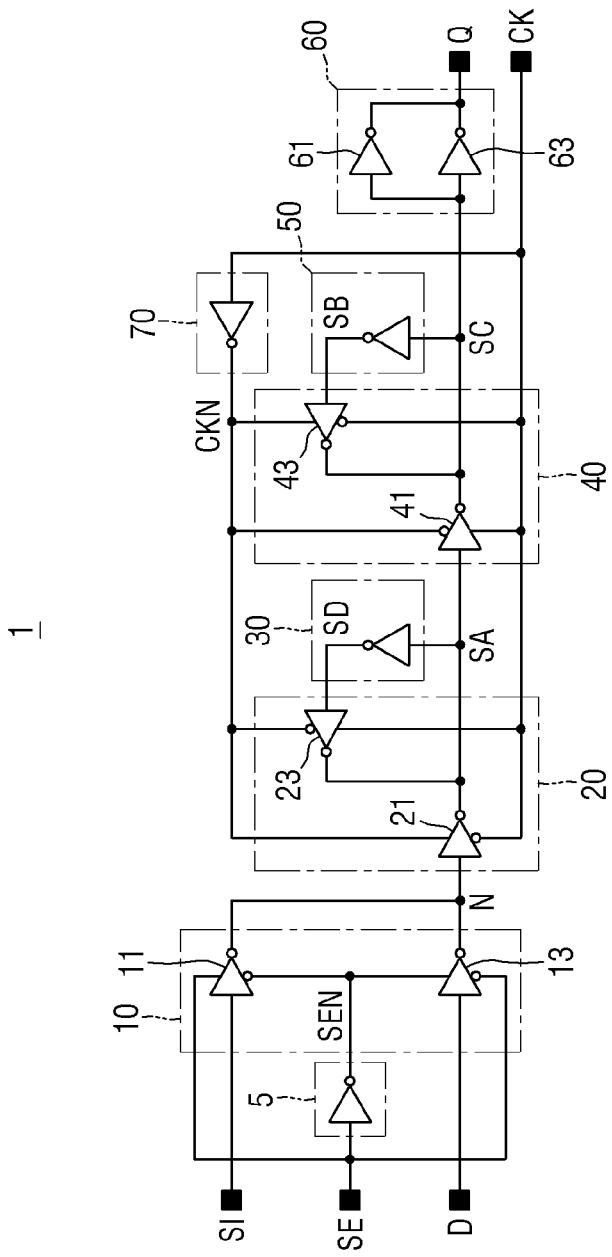
FIG. 2A illustrates a circuit diagram of a semiconductor circuit according to embodiments of the inventive concepts.
Figure 2B:
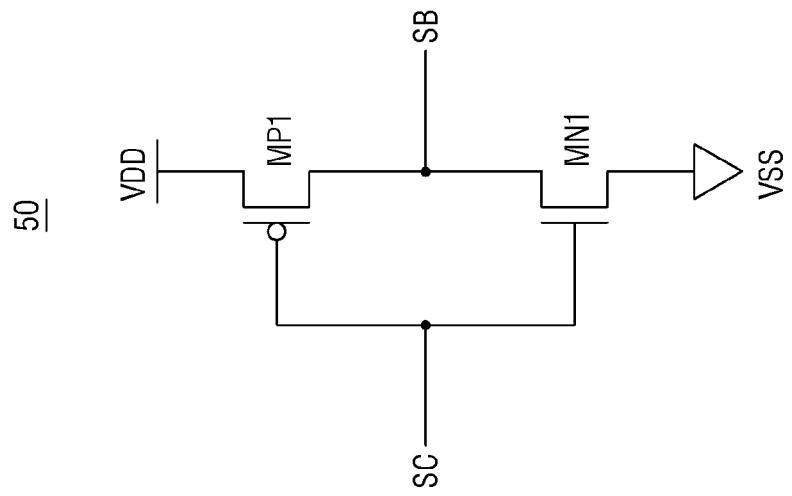
FIG. 2B illustrates a circuit diagram of an embodiment of the feedback inverter in the semiconductor circuit of FIG. 2A.
Figure 2C:
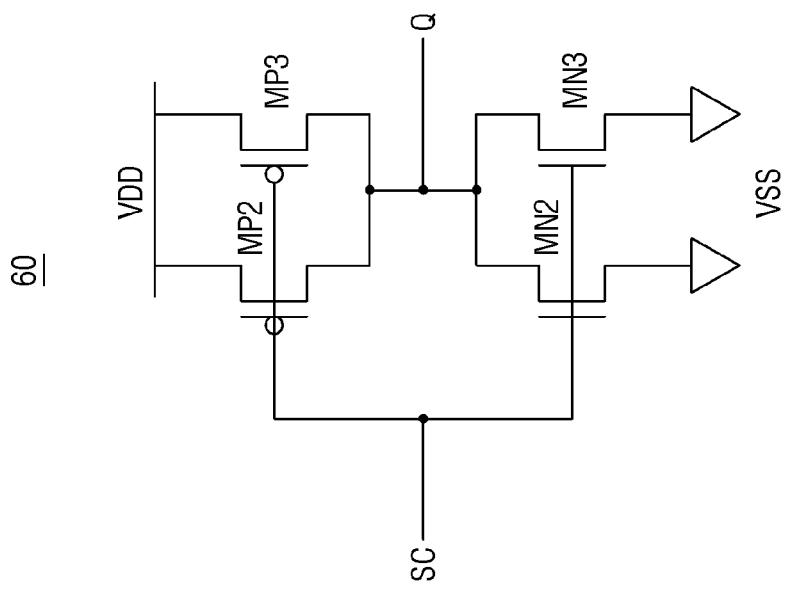
FIG. 2C illustrates a circuit diagram of an embodiment of the output driver in the semiconductor circuit of FIG. 2A.

FIGS. 2A to 2C illustrate circuit diagrams of a semiconductor circuit according to embodiments of the inventive concepts.

FIG. 2A illustrates a circuit diagram of a semiconductor circuit according to embodiments of the inventive concepts. Referring to FIG. 2A, the semiconductor circuit 1 includes scan enable inverter 5, multiplexer 10, latches 20 and 40, feedback inverters 30 and 50, an output driver 60 and a clock inverter 70.

It should be understood that, although FIG. 2A illustrates a scan flip-flop including the scan enable inverter 5, the multiplexer 10, the latches 20 and 40, the feedback inverters 30 and 50, the output driver 60 and the clock inverter 70, embodiments of the inventive concepts are not limited thereto. In particular, the semiconductor circuit of the inventive concepts may include a simple flip-flop in which the scan enable inverter 5 and the multiplexer 10 shown in FIG. 2A are omitted, or a simple latch in which the scan enable inverter 5, the multiplexer 10, the latch 20 and the feedback inverter 30 shown in FIG. 2A are omitted.

The multiplexer 10 receives data D or a scan input signal SI for a scan operation of the semiconductor circuit, and provides one of the data D and the scan input signal SI to the node N responsive to the output of the scan enable inverter 5. The scan enable inverter 5 and the multiplexer 10 may collectively be characterized as an input selecting circuit.

The scan enable inverter 5 receives a scan enable signal SE, outputs an inverted scan enable signal SEN obtained by inverting the scan enable signal SE, and provides the inverted scan enable signal SEN to the multiplexer 10.

The multiplexer 10 selects one of the data D or the scan input signal SI depending on the value of the inverted scan enable signal SEN provided from the scan enable inverter 5, and provides the selected one of data D and the scan input signal SI to the node N. The multiplexer 10 includes tri-state inverters 11 and 13. When the scan enable signal SE is logic high and the inverted scan enable signal SEN is logic low, the tri-state inverter 11 inverts the scan input signal SI and outputs it to the node N. When the scan enable signal SE is logic low and the inverted scan enable signal SEN is logic high, the tri-state inverter 13 inverts data D and outputs it to the node N.

The clock inverter 70 receives the clock signal CK, and outputs an inverted clock signal CKN obtained by inverting the clock signal CK. The clock signal CK and the inverted clock signal CKN are provided to the latches 20 and 40.

The latch 20 latches the signal at the node N and transmits it to the node SA, on the basis of the clock signal CK and the inverted clock signal CKN. The latch 20 includes tri-state inverters 21 and 23. When the clock signal CK is logic low and the inverted clock signal CKN is logic high, the tri-state inverter 21 inverts the signal at the node N and outputs it to the node SA. When the clock signal CK is logic high and the inverted clock signal CKN is logic low, the tri-state inverter 21 disconnects the node SA from the node N.

The feedback inverter 30 receives the output signal of the latch 20 via the node SA, and provides the output signal as feedback to the latch 20. Specifically, the feedback inverter 30 inverts the output signal of the tri-state inverter 21 applied to the node SA, thereby providing a feedback signal, which is output to the node SD, to the latch 20. When the clock signal CK is logic high and the inverted clock signal CKN is logic low, the node SA is disconnected from the node N, and the tri-state inverter 21 inverts the signal provided from the feedback inverter 30 and outputs it to the node SA. As a result, the signal latched by the tri-state inverter 21 from the node N is maintained at the same value during a time when the clock signal CK is logic high.

The latch 40 latches the signal at the node SA and transmits it to the node SC on the basis of the clock signal CK and the inverted clock signal CKN. The latch 40 includes tri-state inverters 41 and 43. When the clock signal CK is logic high and the inverted clock signal CKN is logic low, the tri-state inverter 41 inverts the signal at the node SA and outputs it to the node SC. When the clock signal CK is logic low and the inverted clock signal CKN is logic high, the tri-state inverter 41 disconnects the node SC from the node SA.

The feedback inverter 50 receives the output signal of the latch 40 via the node SC and provides the output signal as feedback to the latch 40. Specifically, the feedback inverter 50 inverts the output signal of the tri-state inverter 41 provided to the node SC, thereby providing a feedback signal, which is output to the node SB, to the latch 40. When the clock signal CK is logic low and the inverted clock signal CKN is logic high, the node SC is disconnected from the node SA, and the tri-state inverter 43 inverts the signal provided from the feedback inverter 50 and outputs it to the node SC. As a result, the signal latched by the tri-state inverter 41 from the node SA is maintained at the same value during a time which the clock signal CK is logic low.

That is, the latch 20 may serve as a master latch that latches the signal of the node N at an rising edge of the clock signal CK and transmits it to the node SA, and the latch 40 may serve as a slave latch that latches the signal transmitted to the node SA and transmits it to the node SC.

The output driver 60 receives the output signal of the latch 40 via the node SC, and outputs the output signal as data Q to the outside. In the present embodiment, the output driver 60 includes an even number of inverters. That is, the output driver 60 includes for example two inverters 61 and 63. In this way, the performance of the output driver 60 may be improved by implementing the output driver 60 as including two or more even number of inverters.

FIG. 2B illustrates a circuit diagram of an embodiment of the feedback inverter 50 of the semiconductor circuit 1 of FIG. 2A. In FIG. 2B, the feedback inverter 50 is implemented by connecting a PMOS transistor MP1 gated by a voltage level of the node SC to provide a power supply voltage VDD to the node SB, with an NMOS transistor MN1 gated to by the voltage level of the node SC to provide a ground voltage VSS to the node SB.

FIG. 2C illustrates a circuit diagram of an embodiment of an output driver 60 of the semiconductor circuit 1 of FIG. 2A including two inverters. In FIG. 2C, the output driver 60 is implemented by connecting PMOS transistors MP2 and MP3 gated by the voltage level of the node SC to provide the power supply voltage VDD to a node Q, with NMOS transistors MN2 and MN3 gated by the voltage level of the node SC to provide the ground voltage VSS to the node Q.

Hereinafter, a layout method for minimizing increase in area of the flip-flop or latch of the semiconductor circuit 1, while improving the performance of the output driver 60 on the basis of the embodiments of FIGS. 2B and 2C, will be described with reference to FIGS. 3 to 5.

Figure 3:
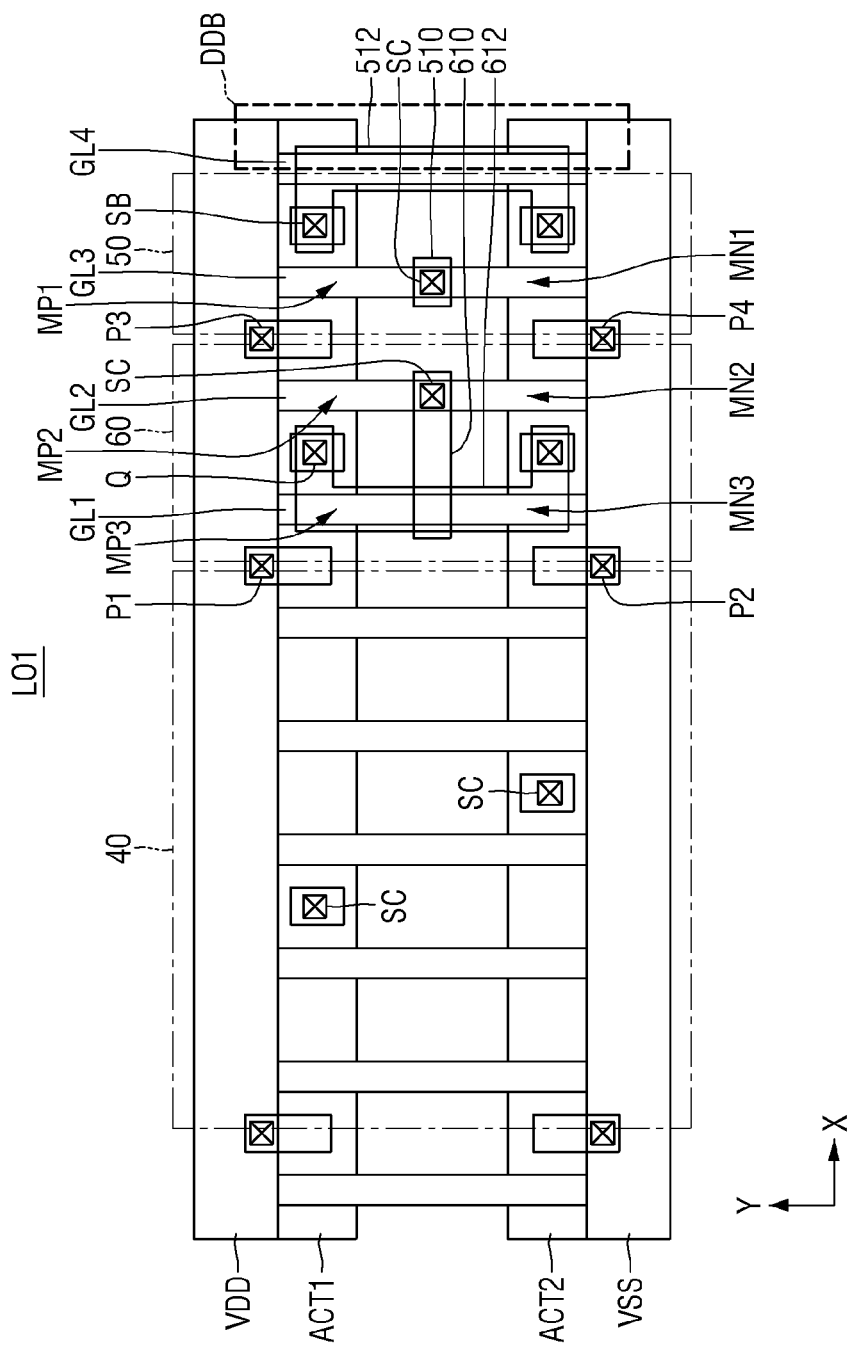
FIG. 3 illustrates a layout diagram of a semiconductor circuit according to embodiments of the inventive concepts.
Figure 4:
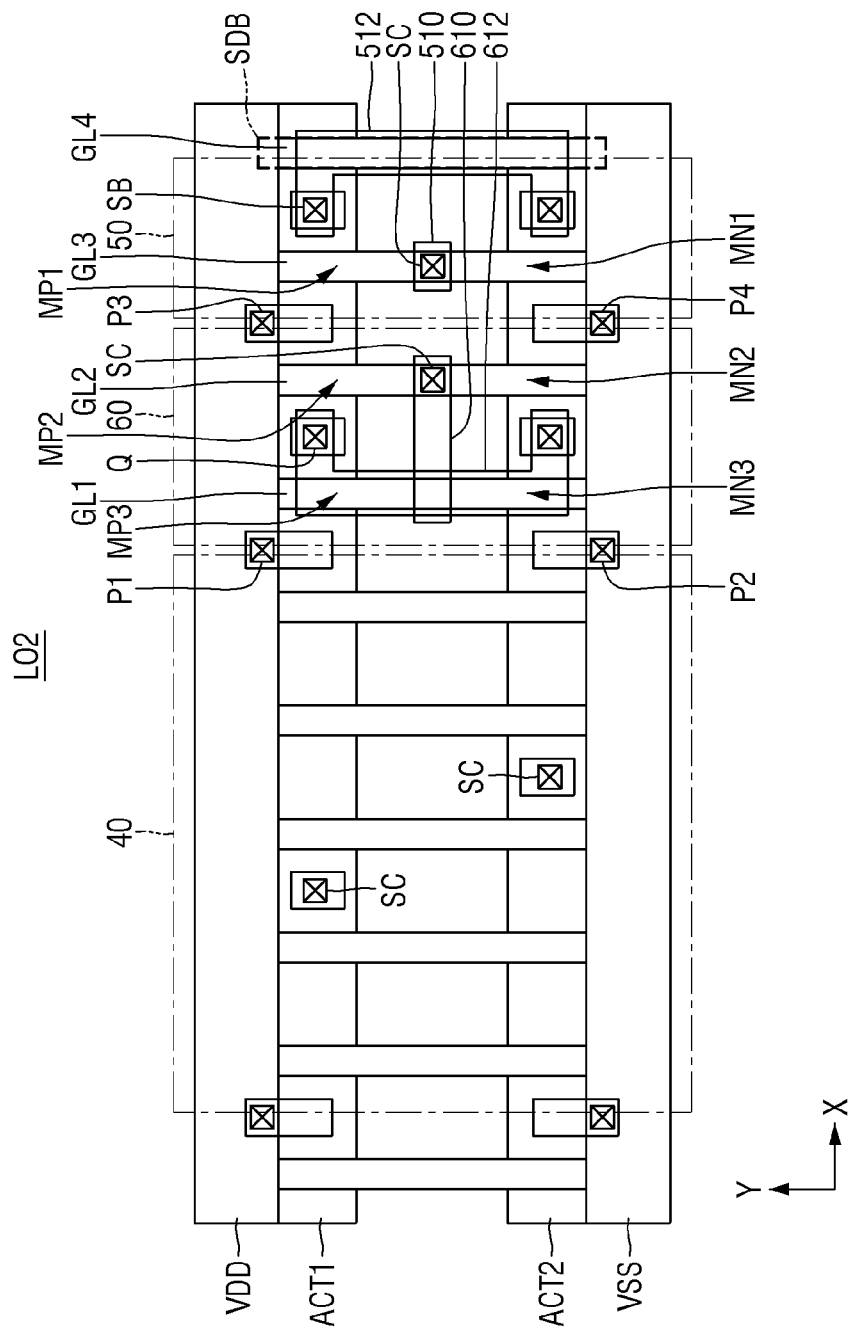
FIG. 4 illustrates another layout diagram of a semiconductor circuit according to embodiments of the inventive concepts.
Figure 5:
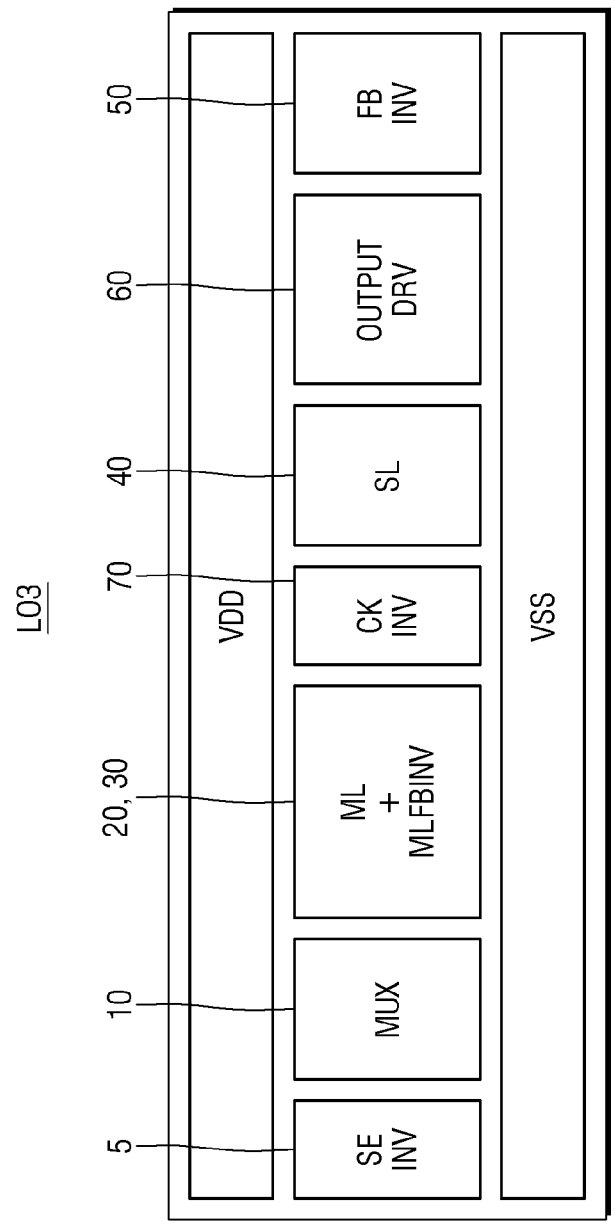
FIG. 5 illustrates another layout diagram of a semiconductor circuit according to embodiments of the inventive concepts.

FIGS. 3 to 5 illustrate respective layout diagrams of semiconductor circuits according to various embodiments of the inventive concepts.

Referring to FIG. 3, a layout LO1 according to embodiments of the inventive concepts includes a latch 40, a feedback inverter 50 and an output driver 60 of the semiconductor circuit 1. In this embodiment, the latch 40, the feedback inverter 50 and the output driver 60 may form a simple latch, and may form a simple flip-flop, together with a master latch 20 which transmits the data D to the input of the latch 40.

In the layout LO1 according to this embodiment, the latch 40 may be disposed adjacent to one side of the output driver 60, and the feedback inverter 50 may be disposed adjacent to another side of the output driver 60. Although FIG. 3 illustrates that the latch 40 is disposed adjacent to the left of the output driver 60 and the feedback inverter 50 is disposed adjacent to the right of the output driver 60, in contrast the latch 40 may be disposed adjacent to the right of the output driver 60 and the feedback inverter 50 may be disposed adjacent to the left of the output driver 60.

Specifically, the latch 40 may be laid out in any form that latches the signal of the node SA and transmits it to the node SC. Therefore, FIG. 3 omits the specific layout configuration of the latch 40, and only illustrates the output terminal thereof provided to the node SC.

The feedback inverter 50 includes a PMOS transistor MP1 and an NMOS transistor MN1. The PMOS transistor MP1 is formed on a gate line GL3 to which the signal of the node SC is applied to provide the power supply voltage VDD to the node SB. The NMOS transistor MN1 is formed on the gate line GL3 to provide the ground voltage VSS to the node SB.

Here, the metal 510 connects the node SC and the gate line GL3, and the metal 512 connects the output of the PMOS transistor MP1 and the output of the NMOS transistor MN1.

The output driver 60 includes PMOS transistors MP2 and MP3, and NMOS transistors MN2 and MN3. The PMOS transistor MP2 is formed on a gate line GL2 to which the signal of the node SC is applied and which is formed adjacent to a gate line GL3 to provide the power supply voltage VDD to the node Q. Further, the NMOS transistor MN2 is formed on the gate line GL2 to provide the ground voltage VSS to the third node Q. On the other hand, the PMOS transistor MP3 is formed on a gate line GL1 to which the signal of the node SC is applied and which is formed adjacent to the gate line GL2 to provide the power supply voltage VDD to the node Q. Further, the NMOS transistor MN3 is formed on the gate line GL1 to provide the ground voltage VSS to the node Q.

Here, the metal 610 connects the node SC, the gate line GL2 and the gate line GL1, and the metal 612 connects the output of the PMOS transistors MP2 and MP3 and the output of the NMOS transistors MN2 and MN3.

In this embodiment, it should be understood that the latch 40, the feedback inverter 50 and the output driver 60 are laid out or disposed to share single active regions ACT1 and ACT2 formed without isolation. That is, since there is no isolation such as a dummy gate line or a diffusion break between the latch 40, the feedback inverter 50 and the output driver 60, the latch 40, the feedback inverter 50 and the active regions ACT1 and ACT2 of the output driver 60 are connected to each other without electrical disconnection.

It should also be understood that the latch 40, the feedback inverter 50 and the output driver 60 share power contacts.

Specifically, the layout LO1 according to the present embodiment includes a VDD power contact P1 and a VSS power contact P2 disposed between the latch 40 and the output driver 60. The latch 40 and the output driver 60 share the power supply voltage VDD and the ground voltage VSS respectively applied via the VDD power contact P1 and the VSS power contact P2.

Further, the layout LO1 according to the present embodiment includes a VDD power contact P3 and a VSS power contact P4 disposed between the output driver 60 and the feedback inverter 50. Further, the output driver 60 and the feedback inverter 50 share the power supply voltage VDD and the ground voltage VSS respectively applied via the VDD power contact P3 and the VSS power contact P4.

In general, when increasing the number of inverters of the output driver 60 from one to two, an area increases by one pitch. However, by avoiding isolation between the latch 40, the feedback inverter 50 and the output driver 60 in the case of the layout LO1 according to the present embodiment, there is an effect of decreasing 2 pitch area in the case of a process of utilizing a DDB (double diffusion break) generated across the gate line GL4. That is, although the area of the output driver 60 increases by one pitch, it is possible to obtain an effect in which the entire area of the latch 40, the feedback inverter 50, and the output driver 60 decreases by one pitch.

Referring to FIG. 4, in contrast to the embodiment of FIG. 3, the present embodiment illustrates the layout LO2 used in the process of generating a single diffusion break (SDB) in the gate line GL4.

Thus, by avoiding isolation between the latch 40, the feedback inverter 50 and the output driver 60 in the case of the layout LO2 according to the present embodiment, there is an effect of decreasing one pitch in the case of a process of using a SDB (single diffusion break) generated across the gate line GL4. That is, although the area of the output driver 60 increases by one pitch, there is an effect in which the entire area of the latch 40, the feedback inverter 50 and the output driver 60 is maintained as it is without any increase or decrease. It should be understood that the layout LO2 of FIG. 4 is similar to the layout LO1 of FIG. 3, and that description of similar features are therefore omitted for brevity.

Referring to FIG. 5, a layout LO3 according to an embodiment of the present disclosure illustrates a 1-bit flip-flop.

The scan enable inverter (SE INV) 5, the multiplexer (MUX) 10, the latch 20 and the feedback inverter 30 (ML+MLFBINV), and the clock inverter (CK INV) 70 may be disposed sequentially in the layout LO3 according to the present embodiment. Subsequently, the latch (SL) 40, the output driver (OUTPUT DRV) 60 and the feedback inverter (FB INV) 50 may be disposed sequentially.

That is, the latch 40 may be disposed adjacent to one side of the output driver 60, and the feedback inverter 50 may be disposed adjacent to another side of the output driver 60. Although FIG. 5 illustrates that the latch 40 is disposed adjacent to the left of the output driver 60 and the feedback inverter 50 is disposed adjacent to the right of the output driver 60, in contrast the latch 40 may be disposed adjacent to the right of the output driver 60 and the feedback inverter 50 may be disposed adjacent to the left of the output driver 60.

With such an arrangement, as described above, it is also possible to prevent or minimize increase in layout area of the flip-flop, while improving the performance of the output driver 60.

FIGS. 6A to 6E illustrate circuit diagrams of a semiconductor circuit according to embodiments of the inventive concepts.

Figure 6A:
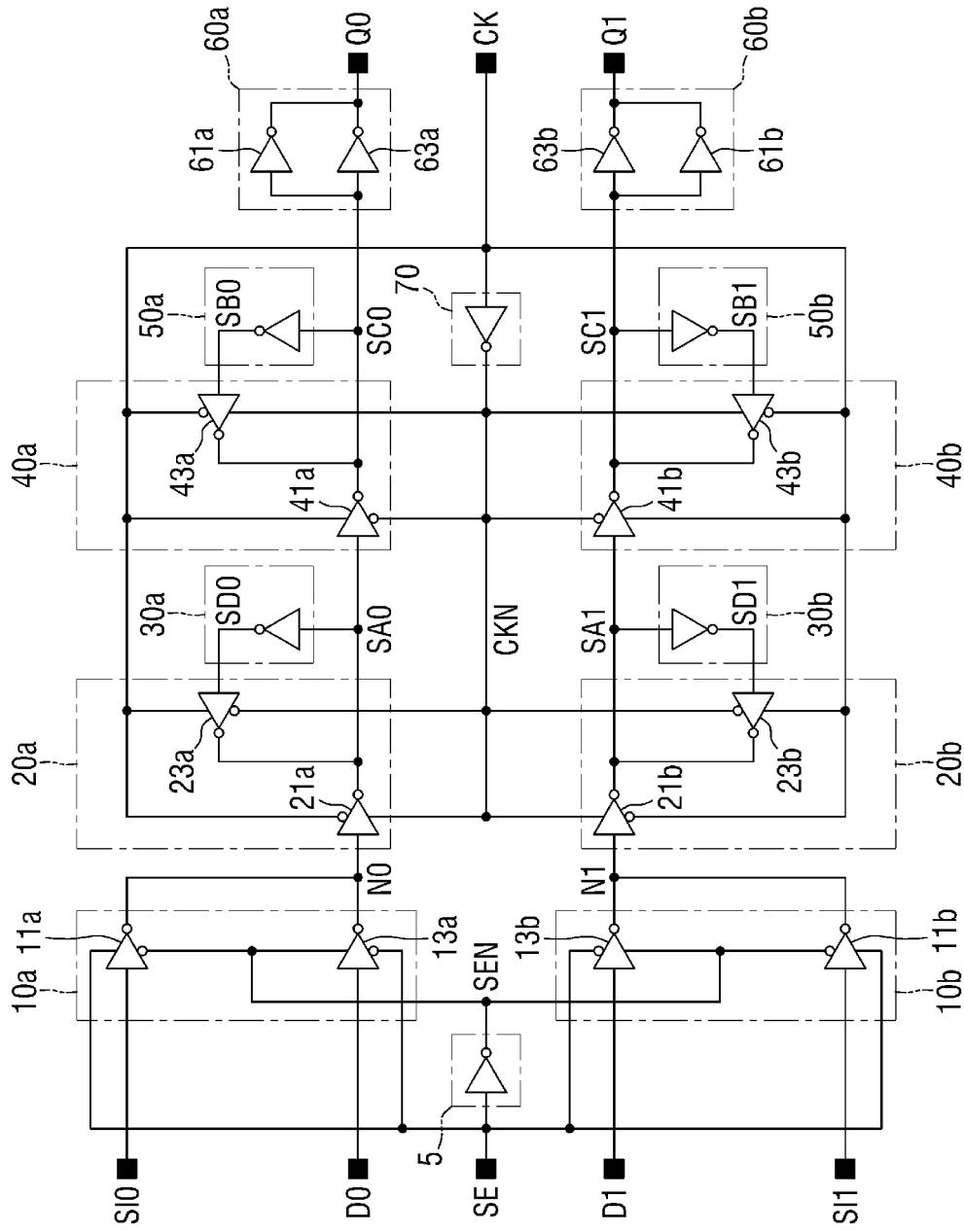
FIG. 6A illustrates a circuit diagram of a semiconductor circuit according to embodiments of the inventive concepts.

FIG. 6A illustrates a circuit diagram of a semiconductor circuit according to an embodiment of the inventive concepts. Referring to FIG. 6A, a semiconductor circuit 2 includes input scan enable inverter 5, multiplexers 10a and 10b, latches 20a, 20b, 40a and 40b, feedback inverters 30a, 30b, 50a and 50b, output drivers 60a and 60b, and a clock inverter 70.

It should be understood that, although FIG. 6A illustrates a multibit scan flip-flop including all of the scan enable inverter 5, multiplexers 10a and 10b, the latches 20a, 20b, 40a and 40b, the feedback inverters 30a, 30b, 50a and 50b, the output drivers 60a and 60b and the clock inverter 70, embodiments of the inventive concepts not limited thereto. For example, the semiconductor circuit of the inventive concepts may include a simple multibit flip-flop in which the scan enable inverter 5 and the multiplexers 10a and 10b are omitted from FIG. 6A, or a simple multi-bit latch in which the scan enable inverter 5, the multiplexers 10a and 10b, the latches 20a and 20b, and the feedback inverters 30a and 30b are omitted from FIG. 6A.

The multiplexer 10a receives the data D0 or the scan input signal SI0 for the scan operation on the semiconductor circuit, and provides one of them to the node N0 responsive to the output of the scan enable inverter 5. The multiplexer 10b receives the data D1 or the scan input signal SI1 for the scan operation on the semiconductor circuit, and provides one of them to the node N1 responsive to the output of the scan enable inverter 5. Specifically, the scan enable inverter 5 and the multiplexers 10a and 10b may collectively be characterized as an input selecting circuit.

The scan enable inverter 5 receives the scan enable signal SE, outputs an inverted scan enable signal SEN obtained by inverting the scan enable signal SE, and then provides the inverted scan enable signal SEN to the multiplexes 10a and 10b.

The multiplexer 10a selects one of the first bit data D0 or the first scan input signal SI0 and provides it to the node N0, in accordance with the value of the inverted scan enable signal SEN provided from the scan enable inverter 5. Further, the multiplexer 10b selects one of the second bit data D1 and the second scan input signal SI1 and provides it to the node N1, in accordance with the value of the inverted scan enable signal SEN provided from the scan enable inverter 5. Since the tri-state inverters 11a, 11b, 13a and 13b operate in the same manner as the tri-state inverters 11 and 13 described with respect to FIG. 2A, repeated description thereof is omitted.

The clock inverter 70 receives the clock signal CK, and outputs an inverted clock signal CKN obtained by inverting the clock signal CK. The clock signal CK and the inverted clock signal CKN are provided to the latches 20a, 20b, 40a and 40b.

The latch 20a latches the signal of the node N0 on the basis of the clock signal CK and the inverted clock signal CKN and transmits the signal to the node SA0. The feedback inverter 30a receives the output signal of the latch 20a via the node SA0 and provides the output signal thereof as feedback to the latch 20a. Further, the latch 20b latches the signal of the node N1 on the basis of the clock signal CK and the inverted clock signal CKN, and transmits the signal to the node SA1 The feedback inverter 30b receives the output signal of the latch 20b via the node SA1, and provides the output signal thereof as feedback to the latch 20b. Since the tri-state inverters 21a, 21b, 23a and 23b operate in the same manner as the tri-state inverters 21 and 23 described with respect to FIG. 2A, repeated description thereof is omitted.

Next, the latch 40a latches the signal of the node SA0 on the basis of the clock signal CK and the inverted clock signal CKN, and transmits the latched signal to the node SC0. The feedback inverter 50a receives the output signal of the latch 40a via the node SC0, and provides the output signal thereof as feedback to the latch 40a. Further, the latch 40b latches the signal of the node SA1 on the basis of the clock signal CK and the inverted clock signal CKN, and transmits the latched signal to the node SC1. The feedback inverter 50b receives the output signal of the latch 40b via the node SC1, and provides the output signal thereof as feedback to the latch 40b. Since the tri-state inverters 41a, 41b, 43a and 43b operate in the same manner as the tri-state inverters 41 and 43 described with respect to FIG. 2A, repeated description thereof is omitted.

That is, the latches 20a and 20b may serve as master latches that latch the signals of the nodes N0 and N1 at the rising edge of the clock signal CK and transmit the signals to the nodes SA0 and SA1, and the latches 40a and 40b may serve as slave latches that latch signals transmitted to the nodes SA0 and SA1 and transmit the signals to the nodes SC0 and SC1.

The output driver 60a receives the output signal of the latch 40a via the node SC0, and outputs the output signal thereof as data Q0 to the outside. In the present embodiment, it should be understood that the output driver 60a includes an even number of inverters. That is, the output driver 60a includes for example two inverters 61a and 63a. In this way, by implementing the output driver 60a as including two or more even-numbered inverters, it is possible to improve the performance of the output driver 60a.

The output driver 60b receives the output signal of the latch 40b via the node SC1, and outputs the output signal thereof as data Q1 to the outside. In the present embodiment, it should be understood that the output driver 60b includes an even number of inverters. That is, the output driver 60b includes for example two inverters 61b and 63b. In this way, by implementing the output driver 60b to include two or more even-numbered inverters, the output driver 60b may be improved in performance.

Figure 6B:
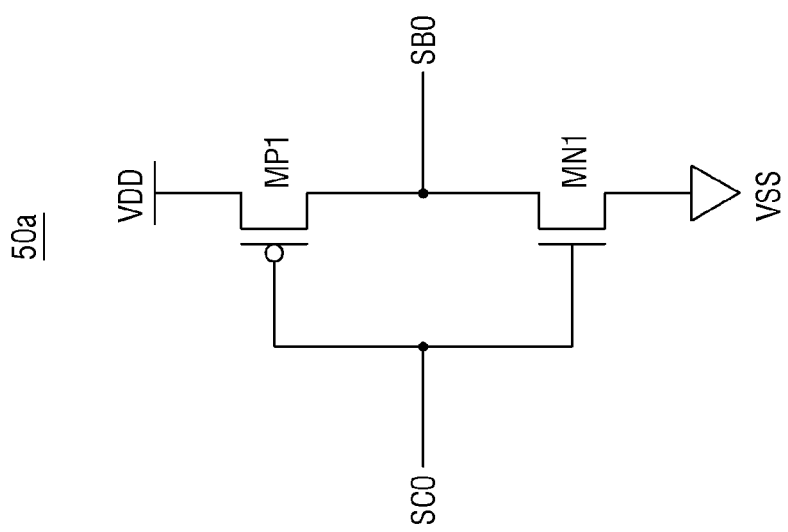
FIG. 6B illustrates a circuit diagram of an embodiment of a first feedback inverter in the semiconductor circuit of FIG. 6A.

FIG. 6B illustrates a circuit diagram of an embodiment of the feedback inverter 50a of the semiconductor circuit 2 of FIG. 6A. In FIG. 6B, the feedback inverter 50a is implemented by connecting a PMOS transistor MP1 gated by the voltage level of the node SC0 to provide the power supply voltage VDD to the node SB0, with an NMOS transistor MN1 gated by a voltage level of the node SC0 to provide the ground voltage VSS to the node SB0.

Figure 6C:
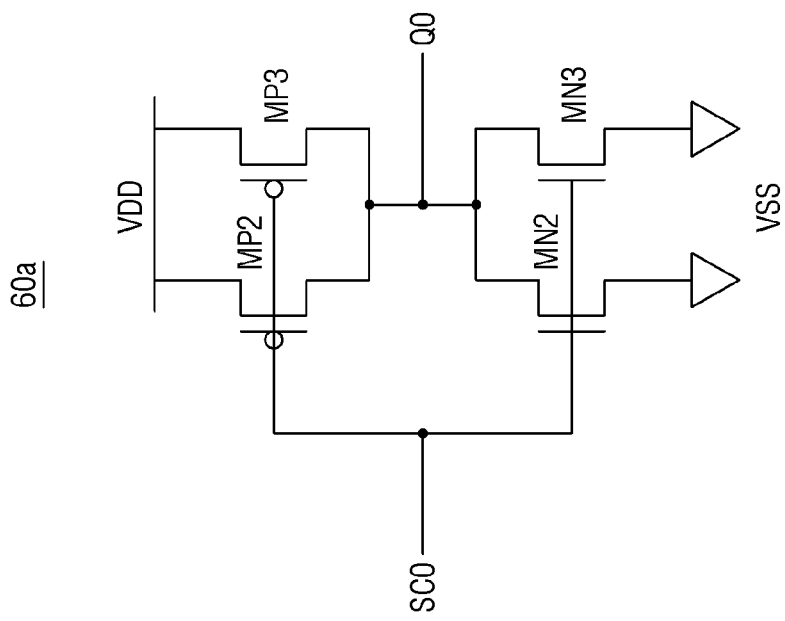
FIG. 6C illustrates a circuit diagram of an embodiment of a first output driver in the semiconductor circuit of FIG. 6A.

FIG. 6C illustrates a circuit diagram of an embodiment of an output driver 60a of the semiconductor circuit 2 of FIG. 6A including two inverters. In FIG. 6C, the output driver 60a is implemented by connecting PMOS transistors MP2 and MP3 gated by the voltage level of the node SC0 to provide the power supply voltage VDD to the node Q0, with NMOS transistors MN2 and MN3 gated by the voltage level of the node SC0 to provide the ground voltage VSS to the node Q0.

Figure 6D:
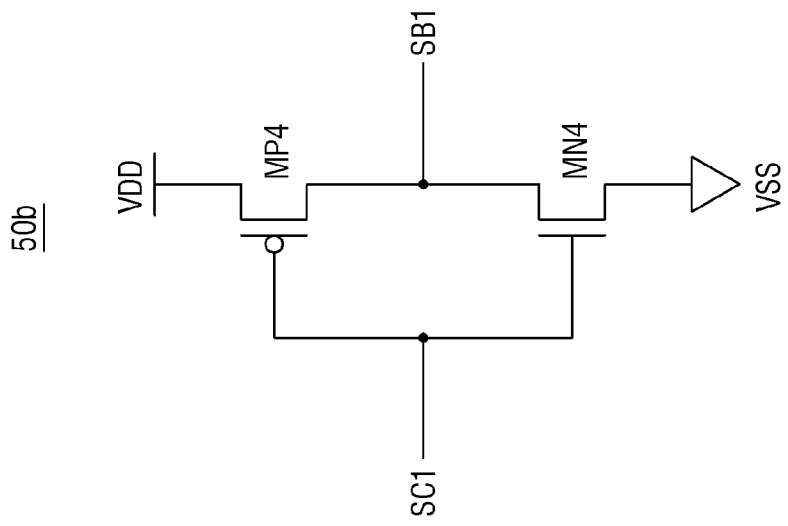
FIG. 6D illustrates a circuit diagram of an embodiment of a second feedback inverter in the semiconductor circuit of FIG. 6A.

FIG. 6D illustrates a circuit diagram of an embodiment of the feedback inverter 50b of the semiconductor circuit 2 of FIG. 6A. In FIG. 6D, the feedback inverter 50b is implemented by connecting a PMOS transistor MP4 gated by the voltage level of the node SC1 to provide the power supply voltage VDD to the node SB1, with an NMOS transistor MN4 gated by a voltage level of the node SC1 to provide the ground voltage VSS to the node SB1.

Figure 6E:
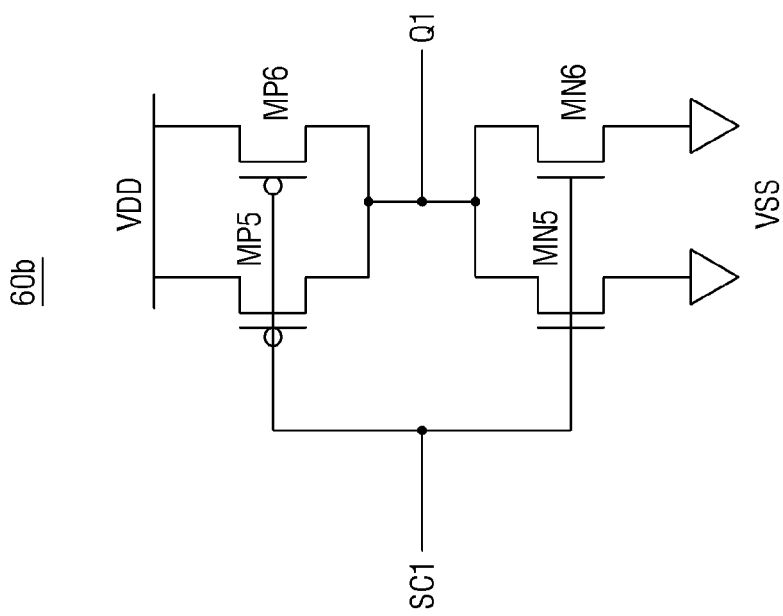
FIG. 6E illustrates a circuit diagram of an embodiment of a second output driver in the semiconductor circuit of FIG. 6A.

FIG. 6E illustrates a circuit diagram of an embodiment of an output driver 60b of the semiconductor circuit 2 of FIG. 6A including two inverters. In FIG. 6E, the output driver 60b is implemented by connecting PMOS transistor MP5 and MP6 gated by the voltage level of the node SC1 to provide the power supply voltage VDD to the node Q1, with NMOS transistors MN5 and MN6 gated by the voltage level of the node SC1 to provide the ground voltage VSS to the node Q1.

Hereinafter, a layout method for minimizing increase in area of the flip-flop or latch of the semiconductor circuit 2, while improving the performance of the output drivers 60a and 60b on the basis of the embodiment of FIGS. 6B to 6E, will be described with reference to FIGS. 7 to 11.

FIGS. 7 to 11 illustrate respective layout diagrams of semiconductor circuits according to various embodiments of the inventive concepts.

Figure 7:
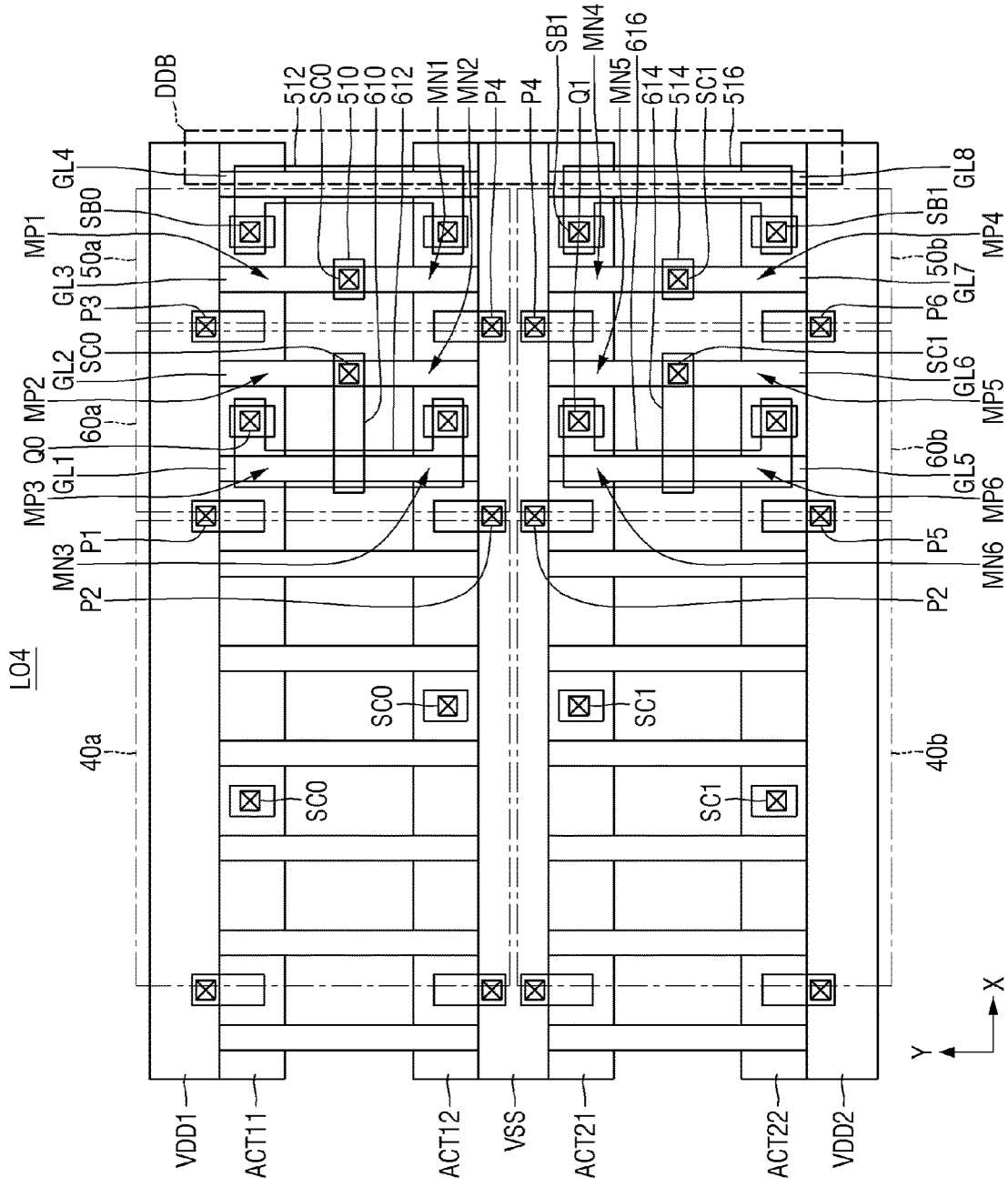
FIG. 7 illustrates a layout diagram of a semiconductor circuit according to embodiments of the inventive concepts.

Referring to FIG. 7, a layout LO4 according to embodiments of the inventive concepts includes latches 40a and 40b, feedback inverters 50a and 50b and output drivers 60a and 60b of the semiconductor circuit 2. In this embodiment, the latches 40a and 40b, the feedback inverters 50a and 50b, and the output drivers 60a and 60b may form a simple multi-bit latch, and may form a simple multi-bit flip-flop, together with the master latches 20a and 20b that transmit data D0 and D1 to the inputs of the latches 40a and 40b.

In the layout LO4 according to the present embodiment, the latches 40a and 40b may be disposed adjacent to one side of the output drivers 60a and 60b, and the feedback inverters 50a and 50b may be disposed adjacent to another side of the output drivers 60a and 60b. Although FIG. 7 illustrates that the latches 40a and 40b are disposed adjacent to the left of the output drivers 60a and 60b, and the feedback inverters 50a and 50b adjacent to the right of the output drivers 60a and 60b, in contrast the latches 40a and 40b may be disposed adjacent to the right of the output drivers 60a and 60b, and the feedback inverters 50a and 50b may be disposed adjacent to the left of the output drivers 60a and 60b.

Specifically, the latches 40a and 40b may be laid out in an arbitrary form in which the signals of the nodes SA0 and SA1 are latched and transmitted to the nodes SC0 and SC1. Therefore, FIG. 7 omits the specific layout configuration of the latches 40a and 40b, and illustrates only the output terminals thereof provided to the nodes SC0 and SC1.

The feedback inverter 50a includes a PMOS transistor MP1 and an NMOS transistor MN1. The PMOS transistor MP1 is formed on the gate line GL3 to which the signal of the node SC0 is applied to provide the power supply voltage VDD1 to the node SB0. Further, the NMOS transistor MN1 is formed on the gate line GL3 to provide the ground voltage VSS to the node SB0.

Here, the metal 510 connects the node SC0 and the gate line GL3, and the metal 512 connects the output of the PMOS transistor MP1 and the output of the NMOS transistor MN1.

The feedback inverter 50b includes an NMOS transistor MN4 and a PMOS transistor MP4. The NMOS transistor MN4 is formed on the gate line GL7 to which the signal of the node SC1 is applied to provide the ground voltage VSS to the node SB1. Further, the PMOS transistor MP4 is formed on the gate line GL7 to provide the power supply voltage VDD2 to the node SB1.

Here, the metal 514 connects the node SC1 and the gate line GL7, and the metal 516 connects the output of the NMOS transistor MN4 and the output of the PMOS transistor MP4.

The output driver 60a includes PMOS transistors MP2 and MP3, and NMOS transistors MN2 and MN3. The PMOS transistor MP2 is formed on the gate line GL2 to which the signal of the node SC0 is applied and which is formed adjacent to the gate line GL3 to provide the power supply voltage VDD1 to the node Q0. Further, the NMOS transistor MN2 is formed on the gate line GL2 to provide the ground voltage VSS to the node Q0. Meanwhile, the PMOS transistor MP3 is formed on the gate line GL1 to which the signal of the node SC0 is applied and which is formed adjacent to the gate line GL2 to provide the power supply voltage VDD1 to the node Q0. Further, the NMOS transistor MN3 is formed on the gate line GL1 to provide the ground voltage VSS to the node Q0.

Here, the metal 610 connects the node SC0, the gate line GL2 and the gate line GL1, and the metal 612 connects the output of the PMOS transistors MP2 and MP3 with the output of the NMOS transistors MN2 and MN3.

Further, the output driver 60b includes NMOS transistors MN5 and MN6, and PMOS transistors MP5 and MP6. The NMOS transistor MN5 is formed on the gate line GL6 to which the signal of the node SC1 is applied and which is formed adjacent to the gate line GL7 to provide the ground voltage VSS to the node Q1. Further, the PMOS transistor MP5 is formed on the gate line GL6 to provide the power supply voltage VDD2 to the node Q1. Meanwhile, the NMOS transistor MN6 is formed on the gate line GL5 to which the signal of the node SC1 is applied and which is formed adjacent to the gate line GL6 to provide the ground voltage VSS to the node Q1. Further, the PMOS transistor MP6 is formed on the gate line GL5 to provide the power supply voltage VDD2 to the node Q1.

Here, the metal 614 connects the node SC1, the gate line GL6 and the gate line GL5, and the metal 616 connects the output of the NMOS transistors MN5 and MN6 with the output of the PMOS transistors MP5 and MP6.

In the present embodiment, it should be understood that the latch 40a, the feedback inverter 50a and the output driver 60a are laid out to share single active regions ACT11 and ACT12 formed without isolation, and that the latch 40b, the feedback inverter 50b and the output driver 60b are laid out to share single active regions ACT21 and ACT22 formed without isolation.

It should be further understood that the latch 40a, the feedback inverter 50a and the output driver 60a share power contacts. That is, the layout LO4 according to the present embodiment includes a VDD power contact P1 and a VSS power contact P2 disposed between the latch 40a and the output driver 60a. Further, the latch 40a and the output driver 60a share the power supply voltage VDD1 and the ground voltage VSS respectively applied through the VDD power contact P1 and the VSS power contact P2. Further, the layout LO4 according to the present embodiment includes the VDD power contact P3 and the VSS power contact P4 disposed between the output driver 60a and the feedback inverter 50a. Further, the output driver 60a and the feedback inverter 50a share the power supply voltage VDD1 and the ground voltage VSS respectively applied via the VDD power contact P3 and the VSS power contact P4.

Further, the latch 40b, the feedback inverter 50b and the output driver 60b also share power contacts. That is, the layout LO4 according to the present embodiment includes a VSS power contact P2 and a VDD power contact P5 disposed between the latch 40b and the output driver 60b. Further, the latch 40b and the output driver 60b share the ground voltage VSS and the power supply voltage VDD2 respectively applied via the VSS power contact P2 and the VDD power contact P5. Further, the layout LO4 according to the present embodiment includes a VSS power contact P4 and a VDD power contact P6 disposed between the output driver 60b and the feedback inverter 50b. Further, the output driver 60b and the feedback inverter 50b share the ground voltage VSS and the power supply voltage VDD2 respectively applied via the VSS power contact P4 and the VDD power contact P6.

By avoiding isolation between the latches 40a and 40b, the feedback inverters 50a and 50b and the output drivers 60a and 60b in the case of the layout LO4 according to the present embodiment, there is an effect of decreasing two pitches in the case of a process utilizing double diffusion break DDB generated across the gate lines GL4 and GL8. That is, although the areas of the output drivers 60a and 60b increase by one pitch, there is an effect that the overall area of the latches 40a and 40b, the feedback inverters 50a and 50b and the output drivers 60a and 60b decreases by one pitch.

Figure 8:
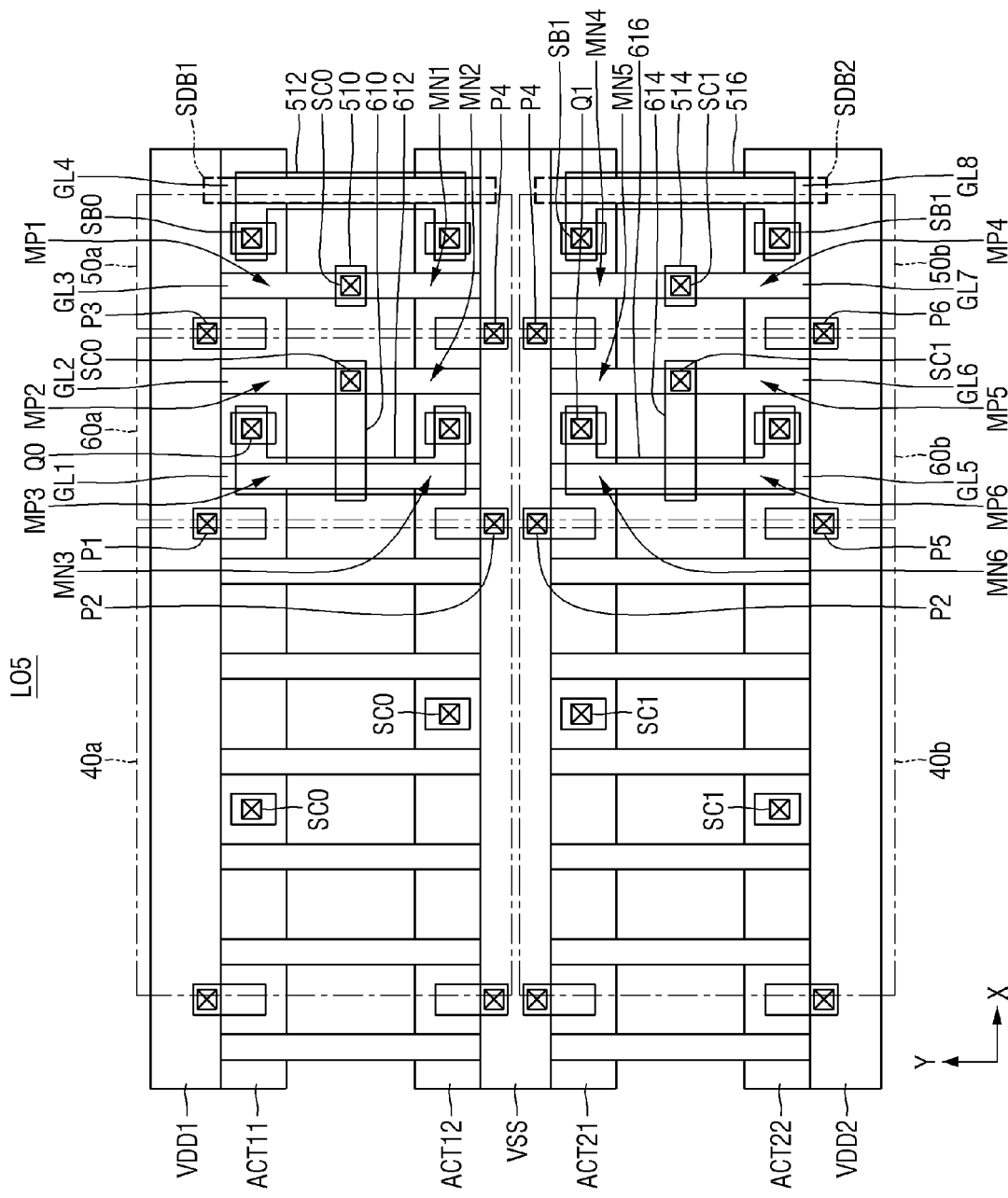
FIG. 8 illustrates another layout diagram of a semiconductor circuit according to embodiments of the inventive concepts.

Referring to FIG. 8, in contrast to the embodiment of FIG. 7, this embodiment indicates a layout LO5 used in the process of generating single diffusion breaks SDB1 and SDB2 on the gate lines GL4 and GL8, respectively.

Accordingly, by avoiding isolation between the latches 40a and 40b, the feedback inverters 50a and 50b and the output drivers 60a and 60b in the case of the layout LO5 according to the present embodiment, there is an effect of decreasing one pitch in the case of the process of utilizing single diffusion breaks SDB1 and SDB2 generated across the gate lines GL4 and GL8. That is, although the area of the output drivers 60a and 60b increases by one pitch, there is an effect that the entire area of the latches 40a and 40b, the feedback inverters 50a and 50b and the output drivers 60a and 60b is maintained as it is without increase or decrease. It should be understood that the layout LO5 of FIG. 8 is similar to the layout LO4 of FIG. 7, and that description of similar features are therefore omitted for brevity.

Figure 9:
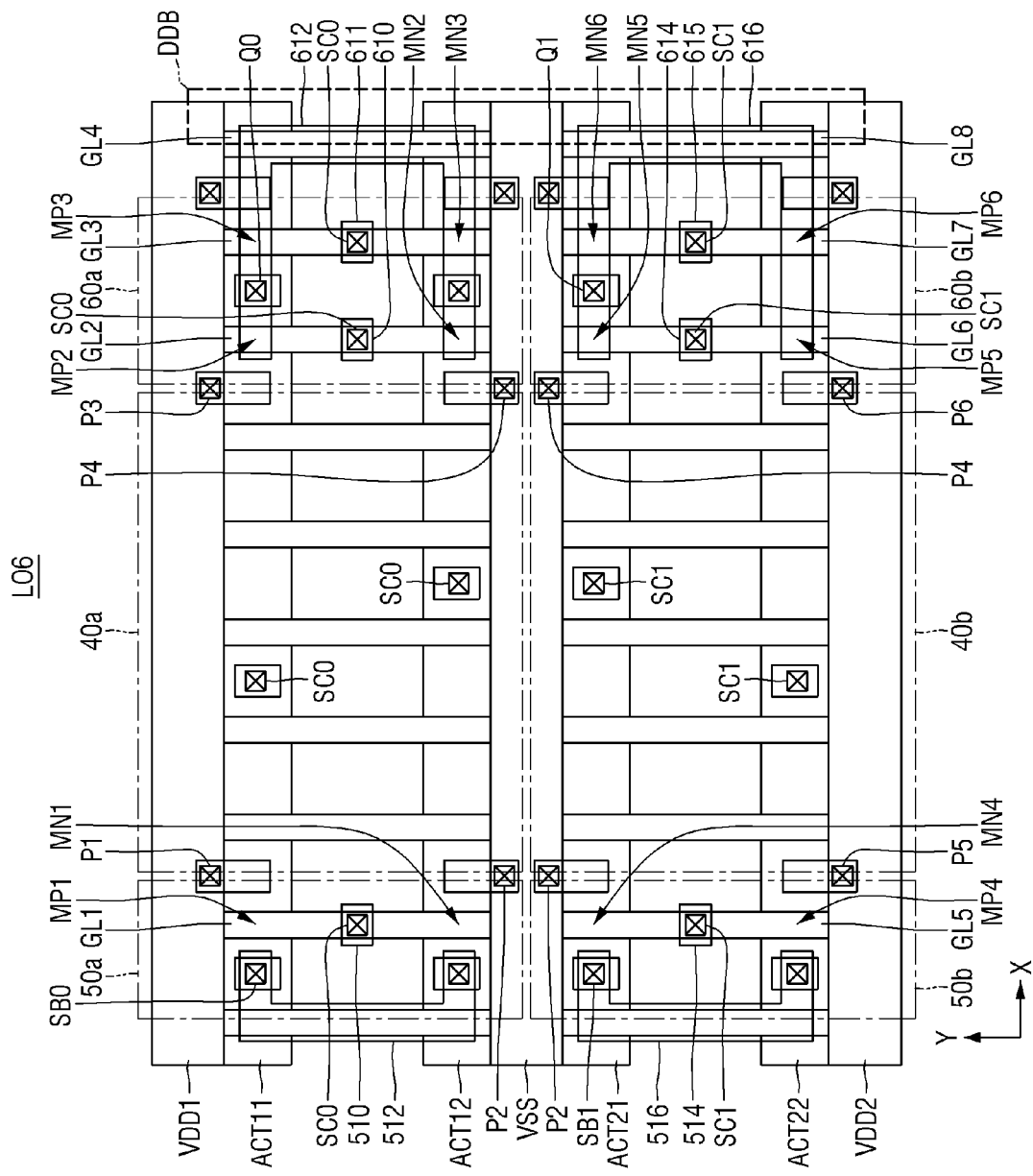
FIG. 9 illustrates still another layout diagram of a semiconductor circuit according to embodiments of the inventive concepts.

Referring to FIG. 9, a layout LO6 according to an embodiment of the inventive concepts differs from the layout LO4 of FIG. 7 in that the feedback inverters 50a and 50b are disposed adjacent to one side of the latches 40a and 40b, and the output drivers 60a and 60b are disposed adjacent to another side of the latches 40a and 40b. Although FIG. 9 illustrates that the feedback inverters 50a and 50b are disposed adjacent to the left of the latches 40a and 40b and the output drivers 60a and 60b are disposed adjacent to the right of the latches 40a and 40b, in contrast the feedback inverters 50a and 50b may be disposed adjacent to the right of the latches 40a and 40b, and the output drivers 60a and 60b may be disposed adjacent to the left of the latches 40a and 40b.

The feedback inverter 50a includes a PMOS transistor MP1 and an NMOS transistor MN1. The PMOS transistor MP1 is formed on the gate line GL1 to which the signal of the node SC0 is applied and which is formed adjacent to one side of the latch 40a to provide the power supply voltage VDD1 to the node SB0. Further, the NMOS transistor MN1 is formed on the gate line GL1 to provide the ground voltage VSS to the node SB0.

Here, the metal 510 connects the node SC0 with the gate line GL1, and the metal 512 connects the output of the PMOS transistor MP1 with the output of the NMOS transistor MN1.

Further, the feedback inverter 50b includes an NMOS transistor MN4 with a PMOS transistor MP4. The NMOS transistor MN4 is formed on a gate line GL5 to which the signal of the node SC1 is applied and which is formed adjacent to one side of the latch 40b to provide the ground voltage VSS to the node SB1. Further, the PMOS transistor MP4 is formed on the gate line GL5 to provide the power supply voltage VDD2 to the node SB1.

Here, the metal 514 connects the node SC1 with the gate line GL5, and the metal 516 connects the output of the NMOS transistor MN4 with the output of the PMOS transistor MP4.

The output driver 60a includes PMOS transistors MP2 and MP3, and NMOS transistors MN2 and MN3. The PMOS transistor MP2 is formed on the gate line GL2 to which the signal of the node SC0 is applied and which is formed adjacent to another side of the latch 40a to provide the power supply voltage VDD1 to the node Q0. Further, the NMOS transistor MN2 is formed on the gate line GL2 to provide the ground voltage VSS to the node Q0. Meanwhile, the PMOS transistor MP3 is formed on the gate line GL3 to which the signal of the node SC0 is applied and which is formed adjacent to the gate line GL2 to provide the power supply voltage VDD1 to the node Q0. Further, the NMOS transistor MN3 is formed on the gate line GL3 to provide the ground voltage VSS to the node Q0.

Here, the metal 610 connects the node SC0 and the gate line GL2, the metal 611 connects the node SC0 and the gate line GL3, and the metal 612 connects the output of the PMOS transistors MP2 and MP3 with the output of the NMOS transistors MN2 and MN3.

The output driver 60b includes NMOS transistors MN5 and MN6, and PMOS transistors MP5 and MP6. The NMOS transistor MN5 is formed on the gate line GL6 to which the signal of the node SC1 is applied and which is formed adjacent to the latch 40b to provide the ground voltage VSS to the node Q1. The PMOS transistor MP5 is formed on the gate line GL6 to provide the power supply voltage VDD2 to the node Q1. The NMOS transistor MN6 is formed on the gate line GL7 to which the signal of the node SC1 is applied and which is formed adjacent to the gate line GL6 to provide the ground voltage VSS to the node Q1. The PMOS transistor MP6 is formed on the gate line GL7 to provide the power supply voltage VDD2 to the node Q1.

Here, the metal 614 connects the node SC1 and the gate line GL6, the metal 615 connects the node SC1 and the gate line GL7, and the metal 616 connects the output of the NMOS transistor MN5 and MN6 with the PMOS transistors MP5 and MP6.

In the present embodiment, it should be understood that the latch 40a, the feedback inverter 50a and the output driver 60a are laid out to share single active regions ACT11 and ACT12 formed without isolation, and that the latch 40b, the feedback inverter 50b and the output driver 60b are laid out to share single active regions ACT21 and ACT22 formed without isolation.

It should also be understood that the latch 40a, the feedback inverter 50a and the output driver 60a share power contacts. That is, the layout LO6 according to the present embodiment includes the VDD power contact P1 and the VSS power contact P2 disposed between the feedback inverter 50a and the latch 40a. The feedback inverter 50a and the latch 40a share the power supply voltage VDD1 and the ground voltage VSS respectively applied through the VDD power contact P1 and the VSS power contact P2. The layout LO6 according to the present embodiment includes a VDD power contact P3 and a VSS power contact P4 disposed between the latch 40a and the output driver 60a. The latch 40a and the output driver 60a share the power supply voltage VDD1 and the ground voltage VSS respectively applied through the VDD power contact P3 and the VSS power contact P4.

The latch 40b, the feedback inverter 50b and the output driver 60b also share power contacts. That is, the layout LO6 according to the present embodiment includes a VSS power contact P2 and a VDD power contact P5 disposed between the feedback inverter 50b and the latch 40b. The feedback inverter 50b and the latch 40b share the ground voltage VSS and the power supply voltage VDD2 respectively applied via the VSS power contact P2 and the VDD power contact P5. The layout LO6 according to the present embodiment includes a VSS power contact P4 and a VDD power contact P6 disposed between the latch 40b and the output driver 60b. The latch 40b and the output driver 60b share the ground voltage VSS and the power supply voltage VDD2 respectively applied via the VSS power contact P4 and the VDD power contact P6.

By preventing isolation between the latches 40a and 40b, the feedback inverters 50a and 50b and the output drivers 60a and 60b in the case of the layout LO6 according to the present embodiment, there is an effect of decreasing two pitches in the case of a process utilizing double diffusion break DDB generated across the gate lines GL4 and GL8. That is, although the area of the output drivers 60a and 60b increases by one pitch, there is an effect that the entire area of the latches 40a and 40b, the feedback inverters 50a and 50b and the output drivers 60a and 60b decreases by one pitch.

Figure 10:
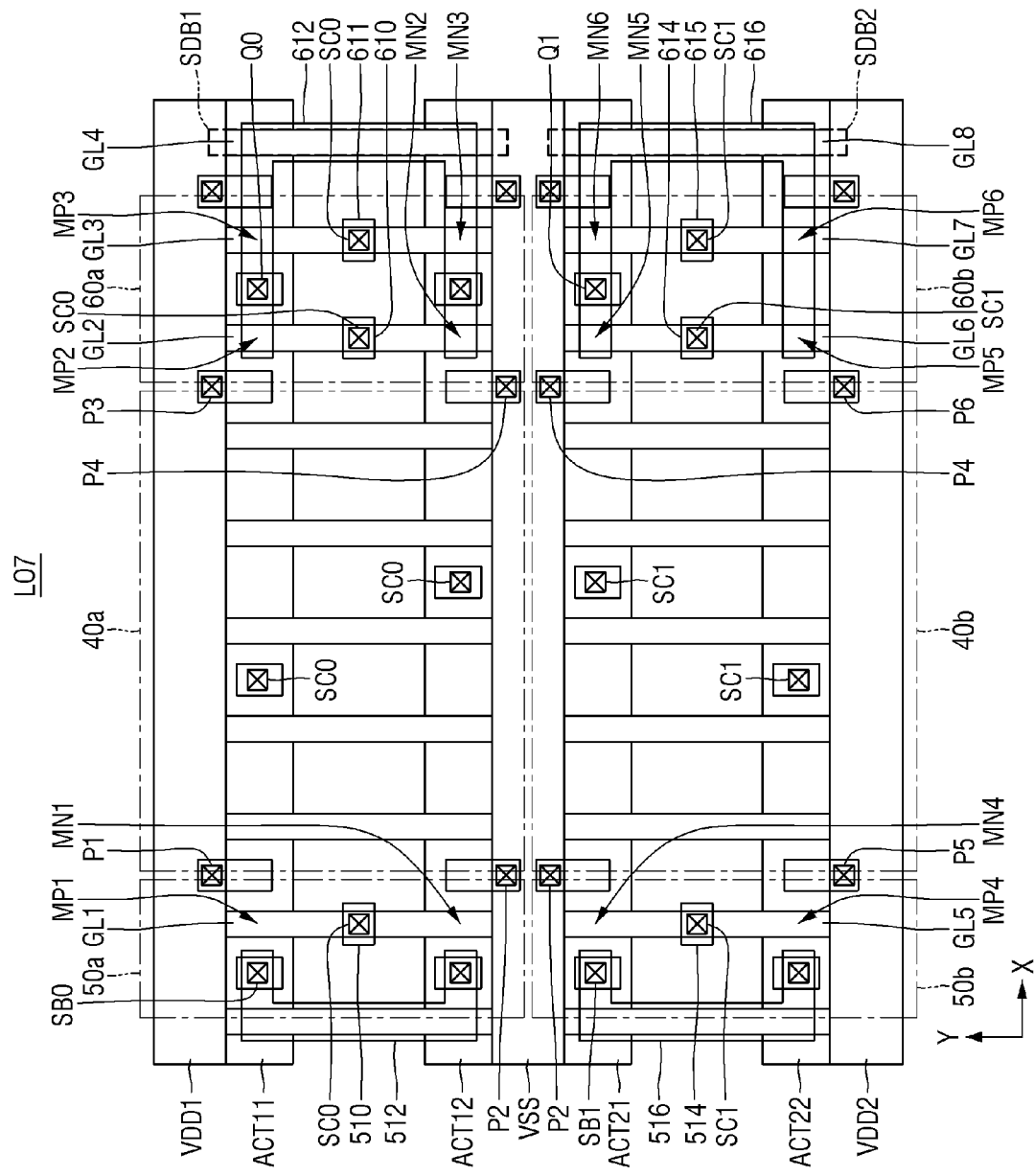
FIG. 10 illustrates another layout diagram of a semiconductor circuit according to embodiments of the inventive concepts.

Referring to FIG. 10, in contrast to the embodiment of FIG. 9, this embodiment illustrates a layout LO7 used in the process of generating single diffusion breaks SDB1 and SDB2 on the gate lines GL4 and GL8, respectively.

Accordingly, by avoiding isolation between the latches 40a and 40b, the feedback inverters 50a and 50b and the output drivers 60a and 60b in the case of the layout LO7 according to the present embodiment, there is an effect of decreasing one pitch in the case of the process of utilizing single diffusion breaks SDB1 and SDB2 generated across the gate lines GL4 and GL8. That is, although the area of the output drivers 60a and 60b increases by one pitch, there is an effect that the entire area of the latches 40a and 40b, the feedback inverters 50a and 50b and the output drivers 60a and 60b is maintained as it is without increase or decrease. It should be understood that the layout LO7 of FIG. 10 is similar to the layout LO6 of FIG. 9, and that description of similar features are therefore omitted for brevity.

Figure 11:
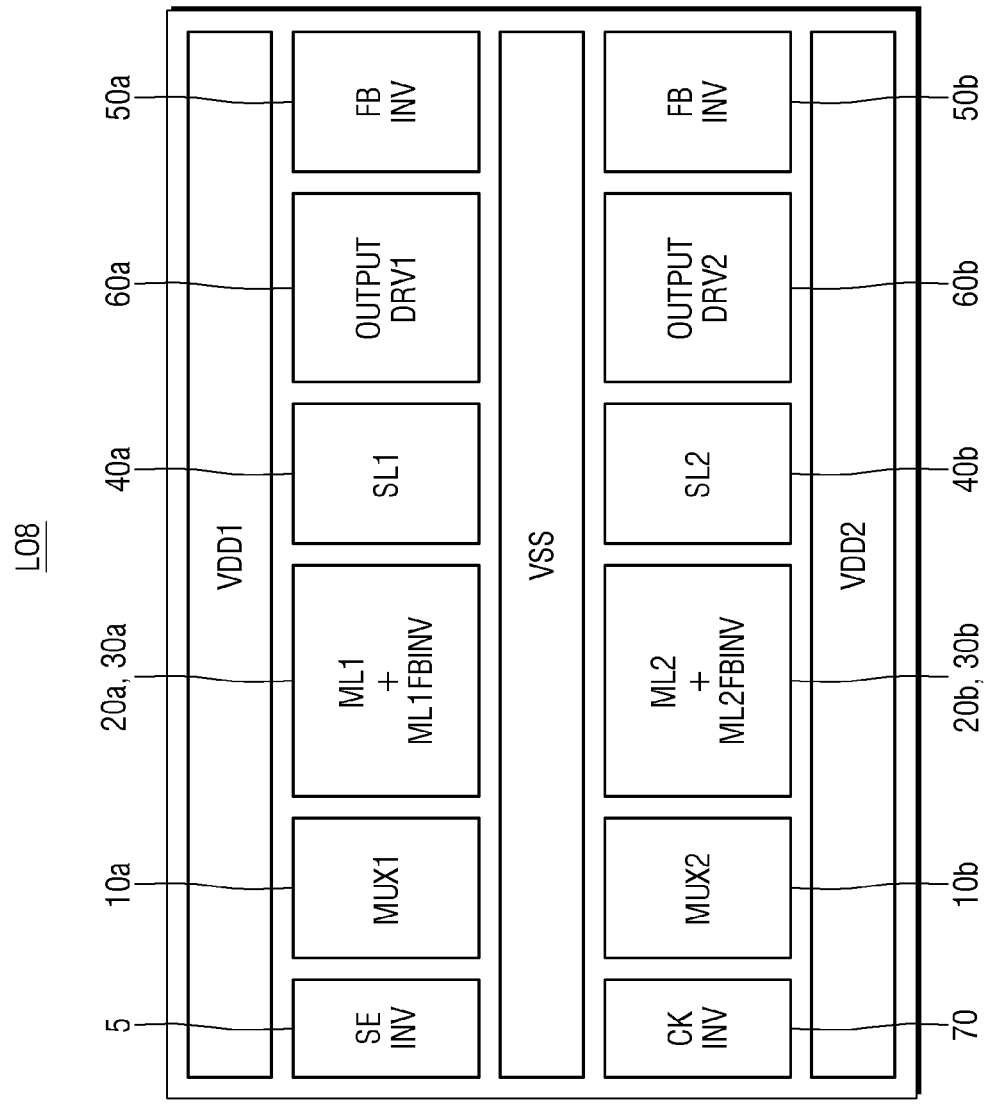
FIG. 11 illustrates another layout diagram of a semiconductor circuit according to embodiments of the inventive concepts.

Referring to FIG. 11, a layout LO8 according to an embodiment of the present disclosure illustrates a 2-bit flip-flop.

In the layout LO8 according to the present embodiment, a scan enable inverter (SE INV) 5, a multiplexer (MUX1) 10a, a latch 20a and a feedback inverter 30a (ML1+ML1FBINV), a latch (SL1) 40a, an output driver (OUTPUT DRV1) 60a and a feedback inverter (FB INV) 50a are sequentially disposed in a first row. Subsequently, a clock inverter (CK INV) 70, a multiplexer (MUX2) 10b, a latch 20b and a feedback inverter 30b (ML2+ML2FBINV), a latch (SL2) 40b, an output driver (OUTPUT DRV2) 60b and a feedback inverter (FB INV) 50b are sequentially disposed in a second row.

That is, the latches 40a and 40b are disposed adjacent to one side of the output drivers 60a and 60b, and the feedback inverters 50a and 50b are disposed adjacent to another side of the output drivers 60a and 60b. Although FIG. 11 illustrates that the latches 40a and 40b are disposed adjacent to the left of the output drivers 60a and 60b, and the feedback inverters 50a and 50b are disposed adjacent to the right of the output drivers 60a and 60b, in contrast the latches 40a and 40b may be disposed adjacent to the right of the output drivers 60a and 60b, and the feedback inverters 50a and 50b may be disposed adjacent to the left of the output drivers 60a and 60b.

Furthermore, the feedback inverters 50a and 50b may be disposed adjacent to one side of the latches 40a and 40b, and the output drivers 60a and 60b may be disposed adjacent to another side of the latches 40a and 40b.

With such an arrangement, as described above, it is possible to prevent or minimize increase in layout area of the flip-flop, while improving the performance of the output driver 60.

It should be understood that many variations and modifications may be made to the various disclosed embodiments without substantially departing from the principles of the inventive concepts. Therefore, the disclosed embodiments should be considered in a generic and descriptive sense only and not for purposes of limitation.

What is claimed is:

1. A semiconductor circuit comprising:
   a latch;
   a feedback inverter configured to receive an output signal of the latch via a first node and to provide a feedback signal to the latch responsive to the output signal of the latch; and
   an output driver configured to receive the output signal of the latch via the first node and to provide an output signal externally of the semiconductor circuit,
   wherein the output driver includes an even number of inverters, and
   the latch, the feedback inverter, and the output driver share a single active region formed without isolation.

2. The semiconductor circuit of claim 1, wherein the latch is disposed adjacent to one side of the output driver, and the feedback inverter is disposed adjacent to another side of the output driver.

3. The semiconductor circuit of claim 2, further comprising a VDD power contact and a VSS power contact disposed between the latch and the output driver, and the latch and the output driver share a power supply voltage and a ground voltage respectively applied via the VDD power contact and the VSS power contact.

4. The semiconductor circuit of claim 2, further comprising a VDD power contact and a VSS power contact disposed between the output driver and the feedback inverter,
wherein the output driver and the feedback inverter share a power supply voltage and a ground voltage respectively applied via the VDD power contact and the VSS power contact.

5. The semiconductor circuit of claim 1, wherein the feedback inverter is disposed adjacent to one side of the latch, and the output driver is disposed adjacent to another side of the latch.

6. The semiconductor circuit of claim 5, further comprising a VDD power contact and a VSS power contact disposed between the feedback inverter and the latch, and
the feedback inverter and the latch share a power supply voltage and a ground voltage respectively applied via the VDD power contact and the VSS power contact.

7. The semiconductor circuit of claim 5, further comprising a VDD power contact and a VSS power contact disposed between the latch and the output driver, and
the latch and the output driver share a power supply voltage and a ground voltage respectively applied via the VDD power contact and the VSS power contact.

8. The semiconductor circuit of claim 1, further comprising:
a master latch configured to transmit data to an input of the latch,
wherein the master latch, the latch, the feedback inverter and the output driver are configured as a flip-flop.

9. The semiconductor circuit of claim 1, wherein the latch comprises a first latch operating on first bit data and a second latch operating on second bit data,
the feedback inverter comprises a first feedback inverter operating on an output signal of the first latch and a second feedback inverter operating on an output signal of the second latch,
the output driver includes a first output driver operating on the output signal of the first latch and a second output driver operating on the output signal of the second latch,
the single active region comprises a first single active region shared by the first latch, the first feedback inverter and the first output driver, and a second single active region shared by the second latch, the second feedback inverter and the second output driver, and
the first latch, the first feedback inverter, the first output driver, the second latch, the second feedback inverter, and the second output driver are configured as a multibit latch.

10. The semiconductor circuit of claim 9, further comprising:
a first master latch configured to transmit the first bit data to an input of the first latch, and a second master latch configured to transmit the second bit data to an input of the second latch,
wherein the first master latch, the first latch, the first feedback inverter, the first output driver, the second master latch, the second latch, the second feedback inverter, and the second output driver are configured as a multibit flip-flop.

11. A semiconductor circuit comprising:
a first PMOS transistor disposed on a first gate line to which a signal of a first node is applied and that provides a power supply voltage to a second node responsive to the signal at the first node;
a first NMOS transistor disposed on the first gate line and that provides a ground voltage to the second node responsive to the signal at the first node,
the first PMOS transistor and the first NMOS transistor configured as a feedback inverter;
a second PMOS transistor disposed on a second gate line to which the signal of the first node is applied and that is disposed adjacent to the first gate line, and that provides the power supply voltage to a third node responsive to the signal at the first node;
a second NMOS transistor disposed on the second gate line and that provides the ground voltage to the third node responsive to the signal at the first node;
a third PMOS transistor disposed on a third gate line to which the signal of the first node is applied and that is disposed adjacent to the second gate line, and that provides the power supply voltage to the third node responsive to the signal at the first node; and
a third NMOS transistor disposed on the third gate line and that provides the ground voltage to the third node responsive to the signal at the first node,
the second PMOS transistor, the second NMOS transistor, the third PMOS transistor and the third NMOS transistor configured as an output driver,
wherein the output driver shares the power supply voltage and the ground voltage with a latch, the power supply voltage and the ground voltage are respectively applied through a first VDD power contact and a first VSS power contact disposed between the output driver and the latch that receives a signal at the second node as a feedback input, and
the output driver shares the power supply voltage and the ground voltage with the feedback inverter, the power supply voltage and the ground voltage are respectively applied through a second VDD power contact and a second VSS power contact disposed between the feedback inverter and the output driver.

12. The semiconductor circuit of claim 11, wherein the latch, the feedback inverter and the output driver share a single active region formed without isolation.

13. The semiconductor circuit of claim 12, further comprising:
a master latch configured to transmit data to an input of the latch,
wherein the master latch, the latch, the feedback inverter and the output driver are configured as a flip-flop.

14. The semiconductor circuit of claim 12, wherein the latch comprises a first latch operating on first bit data and a second latch operating on second bit data,
the feedback inverter comprises a first feedback inverter operating on an output signal of the first latch, and a second feedback inverter operating on an output signal of the second latch, the output driver comprises a first output driver operating on the output signal of the first latch, and a second output driver operating on the output signal of the second latch,
the second latch receives a signal of a fourth node as a feedback signal through a fifth node,
the first feedback inverter includes the first PMOS transistor and the first NMOS transistor,
the second feedback inverter comprises
a fourth NMOS transistor disposed on a fourth gate line to which the signal of the fifth node is applied and that provides the ground voltage to the fourth node responsive to the signal of the fifth node, and a fourth PMOS transistor formed on the fourth gate line and that provides the power supply voltage to the fourth node responsive to the signal of the fifth node, the first output driver includes the second PMOS transistor, the second NMOS transistor, the third PMOS transistor, and the third NMOS transistor, the second output driver comprises a fifth NMOS transistor disposed on a fifth gate line to which the signal of the fifth node is applied and which is disposed adjacent to the fourth gate line, and that provides the ground voltage to a sixth node responsive to the signal of the fifth node, a fifth PMOS transistor disposed on the fifth gate line and that provides the power supply voltage to the sixth node responsive to the signal of the fifth node, a sixth NMOS transistor disposed on a sixth gate line to which the signal of the fifth node is applied and which is disposed adjacent to the fifth gate line, and that provides the ground voltage to the sixth node responsive to the signal of the fifth node, and a sixth PMOS transistor disposed on the sixth gate line and that provides the power supply voltage to the sixth node responsive to the signal of the fifth node, the first latch, the first feedback inverter, the first output driver, the second latch, the second feedback inverter, and the second output driver are configured as a multibit latch.

15. The semiconductor circuit of claim 14, wherein the single active region comprises a first single active region shared by the first latch, the first feedback inverter and the first output driver, and a second single active region shared by the second latch, the second feedback inverter and the second output driver.

16. The semiconductor circuit of claim 14, wherein the second output driver shares the ground voltage and the power supply voltage with the second latch, the ground voltage and the power supply voltage are respectively applied through the first VSS power contact and a third VDD power contact disposed between the second latch and the second output driver, and the second output driver shares the ground voltage and the power supply voltage with the second feedback inverter, the ground voltage and the power supply voltage are respectively applied through the second VSS power contact and a fourth VDD power contact disposed between the second feedback inverter and the second output driver.

17. The semiconductor circuit of claim 14, further comprising:

a first master latch configured to transmit the first bit data to an input of the first latch, and a second master latch configured to transmit the second bit data to an input of the second latch, the first master latch, the first latch, the first feedback inverter, the first output driver, the second master latch, the second latch, the second feedback inverter, and the second output driver are configured as a multibit flip-flop.

18. A semiconductor circuit comprising:

a latch which receives a signal of a first node as a feedback signal via a second node;

a first PMOS transistor disposed on a first gate line to which the signal of the first node is applied and which is disposed adjacent to one side of the latch, and that provides a power supply voltage to the second node responsive to the signal of the first node;

a first NMOS transistor disposed on the first gate line and that provides a ground voltage to the second node responsive to the signal of the first node, the first PMOS transistor and the first NMOS transistor configured as a feedback inverter;

a second PMOS transistor disposed on a second gate line to which the signal of the first node is applied and which is disposed adjacent to another side of the latch, and that provides the power supply voltage to a third node responsive to the signal of the first node;

a second NMOS transistor disposed on the second gate line and that provides the ground voltage to the third node responsive to the signal of the first node;

a third PMOS transistor disposed on a third gate line to which the signal of the first node is applied and which is disposed adjacent to the second gate line, and that provides the power supply voltage to the third node responsive to the signal of the first node; and a third NMOS transistor disposed on the third gate line and that provides the ground voltage to the third node responsive to the signal of the first node, the second PMOS transistor, the second NMOS transistor, the third PMOS transistor and the third NMOS transistor configured as an output driver, wherein the feedback inverter shares the power supply voltage and the ground voltage with the latch, the power supply voltage and the ground voltage are respectively applied through a first VDD power contact and a first VSS power contact disposed between the latch and the feedback inverter, and the output driver shares the power supply voltage and the ground voltage with the latch, the power supply voltage and the ground voltage are respectively applied through a second VDD power contact and a second VSS power contact disposed between the latch and the output driver.

19. The semiconductor circuit of claim 18, wherein the latch, the feedback inverter, and the output driver share a single active region formed without isolation.

20. The semiconductor circuit of claim 19, further comprising:

a master latch configured to transmit data to an input of the latch, wherein the master latch, the latch, the feedback inverter and the output driver are configured as a flip-flop.

* * * * *